(12) United States Patent
Wong et al.

(10) Patent No.: US 7,628,307 B2
(45) Date of Patent: Dec. 8, 2009

(54) APPARATUS FOR DELIVERING SHIELDING GAS DURING WIRE BONDING

(75) Inventors: Yam Mo Wong, Singapore (SG); Ka Shing Kenny Kwan, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 313 days.

(21) Appl. No.: 11/554,108

(22) Filed: Oct. 30, 2006

(65) Prior Publication Data

US 2008/0099531 A1 May 1, 2008

(51) Int. Cl.
*B23K 37/00* (2006.01)
*B23K 20/14* (2006.01)

(52) U.S. Cl. .......................................... 228/4.5; 228/42

(58) Field of Classification Search ............... 228/180.5, 228/105, 218, 4.5, 110.1; 219/56.22, 85.16, 219/85.18, 85.1, 56.1, 56.21
See application file for complete search history.

(56) References Cited

U.S. PATENT DOCUMENTS 4,564,734 A * 1/1986 Okikawa ................. 219/56.22
4,575,602 A * 3/1986 Sakurai ..................... 219/56.21
4,889,274 A * 12/1989 Ramsey ..................... 228/180.5
4,976,393 A * 12/1990 Nakajima et al. ............ 228/111
6,234,376 B1 5/2001 Wican
2007/0000878 A1 * 1/2007 Fujita et al. ............. 219/121.11
2008/0000950 A1 * 1/2008 Nishiura et al. .......... 228/180.5
2008/0035709 A1 * 2/2008 Nishiura et al. ............. 228/176

FOREIGN PATENT DOCUMENTS

JP 360244034 A * 12/1985
JP 361296731 A * 12/1986
JP 362136835 A * 6/1987

* cited by examiner

*Primary Examiner*—Kiley Stoner
(74) *Attorney, Agent, or Firm*—Ostrolenk Faber LLP

(57) ABSTRACT

An apparatus is provided for supplying a shielding gas during the bonding of wires to electronic components with a bonding tool comprising a horn and a capillary. The apparatus comprises a main body with an elongated slot having a width that extends into the main body from a side of the main body generally in a first direction and the slot also extends from a top surface to a bottom surface of the main body in a second direction perpendicular to the first direction for the width of the slot. The slot is sized to receive a tip of the capillary which is operable to pass through the slot in the second direction. A gas outlet, which may be formed inside the slot, supplies shielding gas into the slot.

17 Claims, 4 Drawing Sheets

APPARATUS FOR DELIVERING SHIELDING GAS DURING WIRE BONDING

FIELD OF THE INVENTION

The invention relates to the forming of electrical connections on electronic components, and in particular to the bonding of wires to electronic components during wire bonding.

BACKGROUND AND PRIOR ART

Wire bonding is used to connect electrical contact points of different devices, or different electrical contact points of the same device.

FIG. 1 is a side view of a conventional wire bonding tool and an electronic flame-off (EFO) device. The wire bonding tool includes a horn 10 and a capillary 12 attached to the horn, and also other components such as an ultrasonic transducer (not shown) for generating bonding energy. The EFO device, comprising an EFO torch 14, is positioned adjacent to the capillary 12 of the wire bonding tool. The capillary 12 is configured to travel between a first height adjacent to the EFO torch 14 for sparking, and a second height for bonding.

Bonding wire (not shown) is threaded through a centrally-located hole in the capillary 12 and extends from the narrow tip of the capillary 12. The bonding tool is arranged over an electronic device to be bonded. The electronic device typically comprises a die 16 mounted onto a leadframe 18, and wire connections are usually made between the die 16 and the leadframe 18. A window clamp 20 clamps and secures the electronic device to a worktable. The window clamp 20 has an opening to expose a bonding area on the electronic device at which wire bonding is to be conducted, for access by the capillary 12.

During operation, bonding wire hangs from the tip of the capillary 12. The end of the wire is prepared for bonding by locating the EFO torch 14 at a predetermined distance from the end of the wire and emitting an electrical arc between the end of the wire and the EFO torch 14. The arc forms a molten ball at the end of the bonding wire. By varying the intensity and the duration of the electrical arc, the size of the ball that is formed can be adjusted to specific dimensions. The molten ball is then attached to the bonding surface by the capillary 12 using force and power. Thereafter, the wire is extended to another bonding surface to form a second bond.

When bonding wires made of reactive materials such as copper or aluminum are used for wire bonding, there is a tendency for oxidation of the molten ball to occur when the melted material reacts with oxygen in the atmosphere. Oxidation of the molten ball degrades the quality of the subsequent ball bond that is formed. Therefore, it is necessary to provide a shielding gas comprised of a relatively inert gas such as nitrogen or argon gas to cover and protect the wire during ball formation.

A simple way of supplying such shielding gas would be to position one or more gas nozzle tubes adjacent to the capillary 12 to envelope the end of the bonding wire during molten ball formation. The problem is that, if done in the open, this is not very effective and the results are inconsistent because much of the gas is able to immediately escape into the atmosphere.

An apparatus for containing shielding gas when supplying the gas to bonding wire is disclosed in U.S. Pat. No. 6,234,376 entitled "Supplying a Cover Gas for Wire Ball Bonding". The apparatus includes a gas-containment tube to direct shielding gas to the bonding wire. Transverse in-line orifices are made in the tube to allow the capillary of the bonding tool to enter the gas-containing tube for ball formation, and then to pass through the tube to bond the ball onto a bonding surface.

Although the apparatus is effective for supplying a shielding gas to the bonding wire during ball bonding to protect the molten ball from oxygen in the atmosphere, the containment tube itself is an impediment to viewing the wire bonding process because the containment tube fully encloses the tip of the capillary and hides it from view. Thus, the disclosure teaches that the containment tube should be made of clear quartz glass, or less preferably heat resistant plastics, to allow observance of the ball forming operation. The set-up of the EFO torch relative to the capillary and the containment tube is also difficult because the tip of the EFO torch is located within the containment tube. Thus, the alignment between the EFO torch, capillary and containment tube can only be done with some difficulty by looking through the transparent tube, which also tends to become more opaque over time. Inaccurate alignment among the items can create reliability issues and an erroneous set-up may cause ineffectiveness of the apparatus.

It would therefore be desirable to develop an apparatus for supplying shielding gas to a bonding wire that does not fully enclose the tip of the capillary in order to make it easier to align the various components of the wire bonding tool and also to make it possible to directly view the ball forming operation.

SUMMARY OF THE INVENTION

It is thus an object of the invention to seek to provide an improved apparatus for supplying a shielding gas to bonding wire during ball forming operations that avoids some of the aforesaid shortcomings of prior art apparatus for this purpose.

Accordingly, the invention provides an apparatus for supplying a shielding gas during wire bonding with a bonding tool comprising a horn and a capillary, the apparatus comprising: a main body; an elongated slot having a width that extends into the main body from a side of the main body generally in a first direction and that extends from a top surface to a bottom surface of the main body in a second direction perpendicular to the first direction for the width of the slot, the slot being sized to receive a tip of the capillary which is operable to pass through the slot in the second direction; and a gas outlet operative to supply shielding gas into the slot.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of preferred embodiments of a gas supplying apparatus in accordance with the invention will now be described with reference to the accompanying drawings, in which.

DETAILED DESCRIPTION OF THE PREFERRED EMBODIMENT OF THE INVENTION

Figure 1:
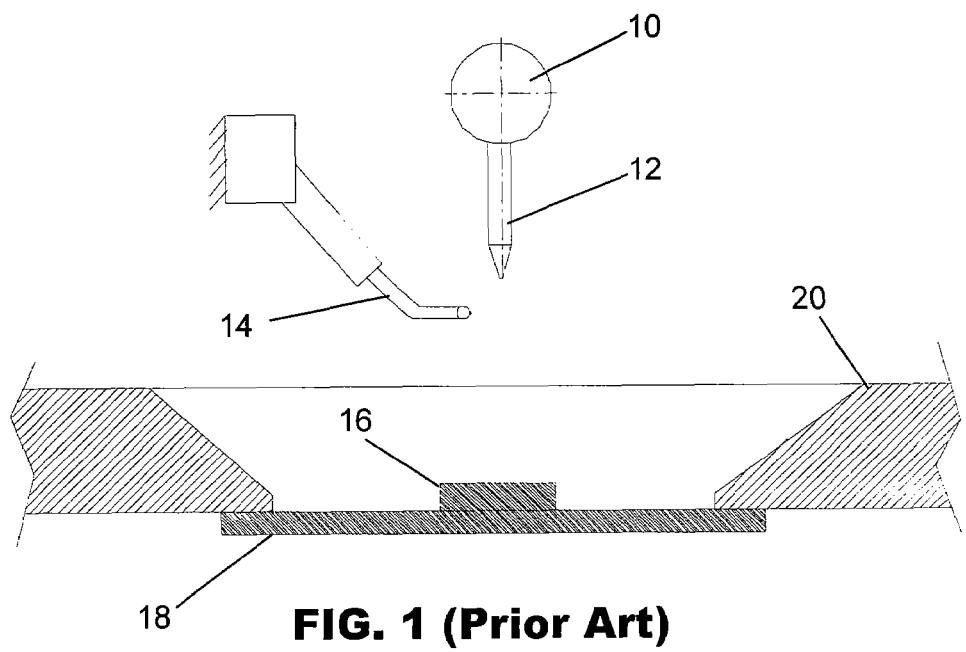
FIG. 1 is a side view of a conventional wire bonding tool and an electronic flame-off (EFO) device.
Figure 2:
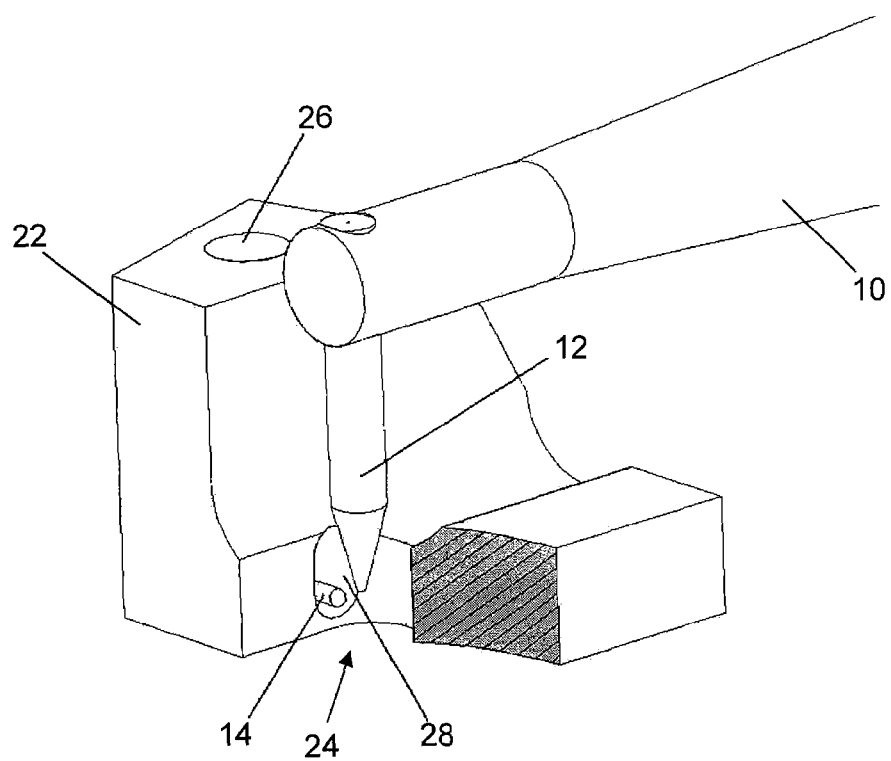
FIG. 2 is an isometric view of a gas supplying apparatus according to a first preferred embodiment of the invention with part of the apparatus removed to show a position of a tip of a capillary relative to an EFO torch.

FIG. 2 is an isometric view of a gas supplying apparatus 22 according to a first preferred embodiment of the invention with part of the apparatus removed to show a position of a tip of a capillary 12 relative to an EFO torch 14. The apparatus 22 comprises a main body which may be in the form of a block of material that is suitably shaped so as to allow the horn 10 of the bonding tool to be located close to it without contacting it during ball formation as well as during actual bonding of a molten ball.

In particular, the apparatus 22 includes an elongated slot 24 having a width that extends into the main body from a side of the main body generally in a first direction and that extends from a top surface to a bottom surface of the main body in a second direction perpendicular to the first direction for the width of the slot. The slot 24 is generally in the shape of a U-shaped recess.

This slot 24 is sized to be wide enough to receive a tip of the capillary 12 in the slot 24, and the capillary 12 is operable to pass through the slot 24 vertically in the second direction. A main gas inlet 26 is located on the apparatus 22 in order to connect the apparatus to a gas supply source (not shown) for introducing a relatively inert shielding gas, such as nitrogen or argon gas, into the slot 24 via a gas outlet 28 that is preferably formed inside the slot 24. The gas outlet 28 is in fluid communication with the main gas inlet 26 through a conduit such as a vacuum channel. The shielding gas emitted from the gas outlet 28 occupies the space in the slot 24 and displaces any oxygen within the space.

Preferably, the EFO torch 14 is fitted inside the apparatus 22 and the end of the EFO torch 14 protrudes slightly into the slot 24. More preferably, the end of the EFO torch 14 is coincident with and protrudes out of the gas outlet 28. The narrow width of the slot 24 that is not substantially larger than a width of the capillary 12 also helps to minimize the air space surrounding the end of the bonding wire at the tip of the capillary 12. The small confined space retains and maintains a high concentration of shielding gas consistently throughout the ball formation process.

Figure 3:
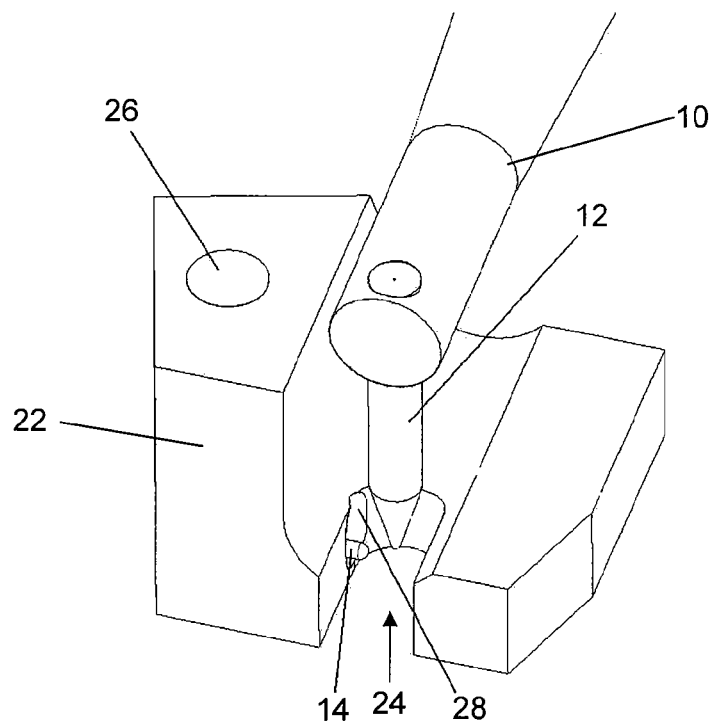
FIG. 3 is another isometric view of the gas supplying apparatus as shown in FIG. 2.

FIG. 3 is another isometric view of the gas supplying apparatus 22 as shown in FIG. 2. It shows the complete slot 24 of the apparatus 22 in the shape of a U-shaped recess. The slot 24 has an opening on the side of the main body of the apparatus that is preferably aligned with a longitudinal axis of the horn 10 such that the first direction in which the slot 24 extends is generally parallel to the longitudinal axis of the horn 10. Furthermore, the slot 24 may comprise side walls extending in the first direction that are substantially parallel. Positioning the opening of the slot 24 in front of the horn 10 has the advantage that an operator standing in front of the bonding tool is able to have an unencumbered view of the capillary 12 from the side of the main body that is not blocked by a part of the main body throughout a range of motion of the capillary 12 during wire bonding. It also facilitates the aligning of the capillary 12, EFO torch 14 and gas supplying apparatus 22 by the operator since the operator can easily see all the respective components.

Figure 4:
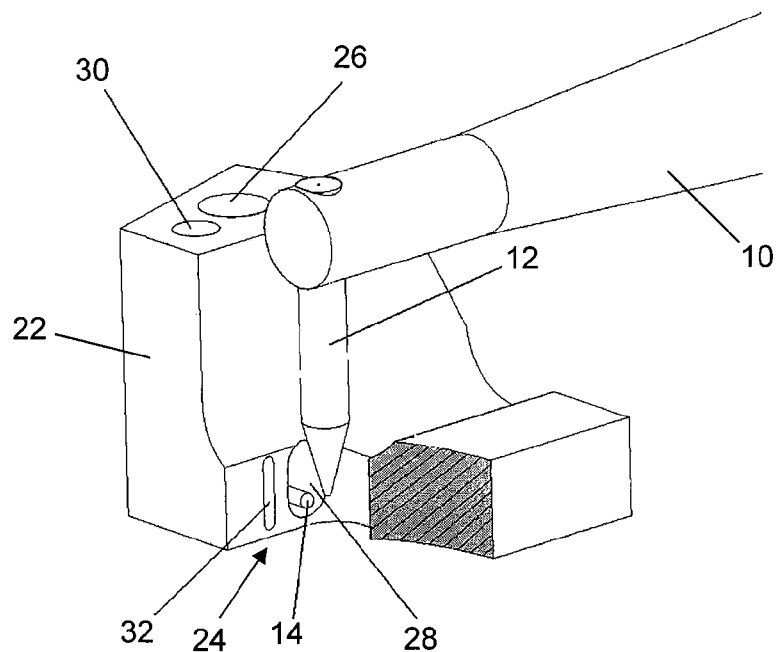
FIG. 4 is an isometric view of a gas supplying apparatus according to a second preferred embodiment of the invention with part of the apparatus removed to show a position of a tip of a capillary relative to an EFO torch.

FIG. 4 is an isometric view of a gas supplying apparatus 22 according to a second preferred embodiment of the invention with part of the apparatus removed to show a position of a tip of a capillary 12 relative to an EFO torch 14. The difference between the first and second embodiments is that the second embodiment further comprises a secondary gas inlet 30 that is in fluid communication with at least one secondary gas outlet 32 which is preferably formed inside the slot 24. This is useful to introduce more shielding gas into the slot 24 if the application requires it.

Figure 5:
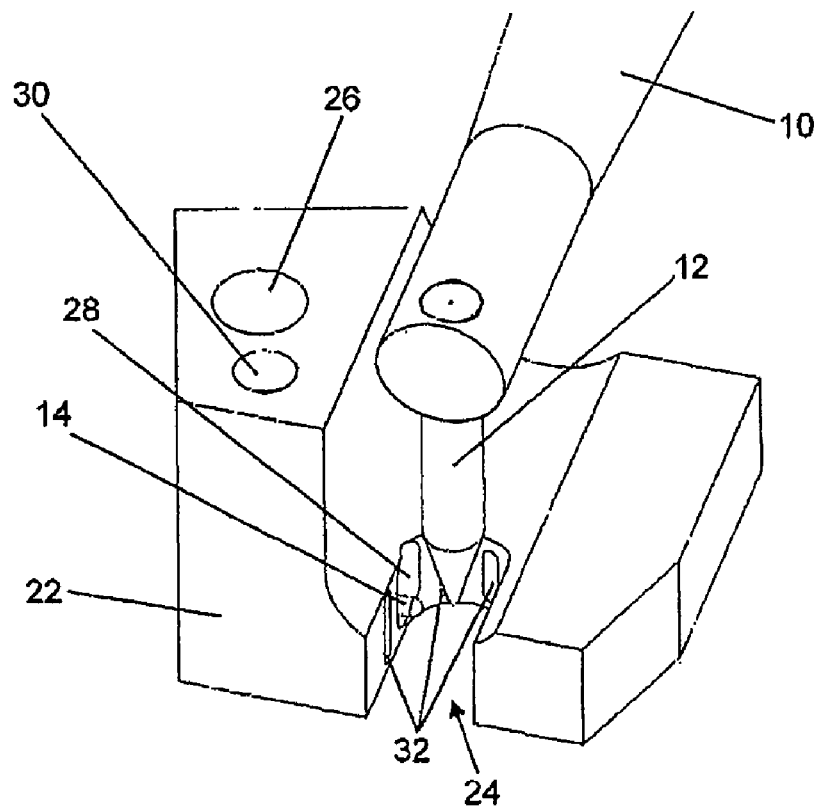
FIG. 5 is another isometric view of the gas supplying apparatus as shown in FIG. 4.

FIG. 5 is another isometric view of the gas supplying apparatus 22 as shown in FIG. 4. In this view, more than one secondary gas outlet 32 can be seen. Again, the opening of the slot 24 is aligned with the longitudinal axis of the horn 10 and preferably faces the operator. The amount of shielding gas supplied through the gas outlet 28 and secondary gas outlets 32 respectively should preferably be independently controllable in order to meet the specific process requirements for wire ball formation and oxidation protection.

Figure 6:
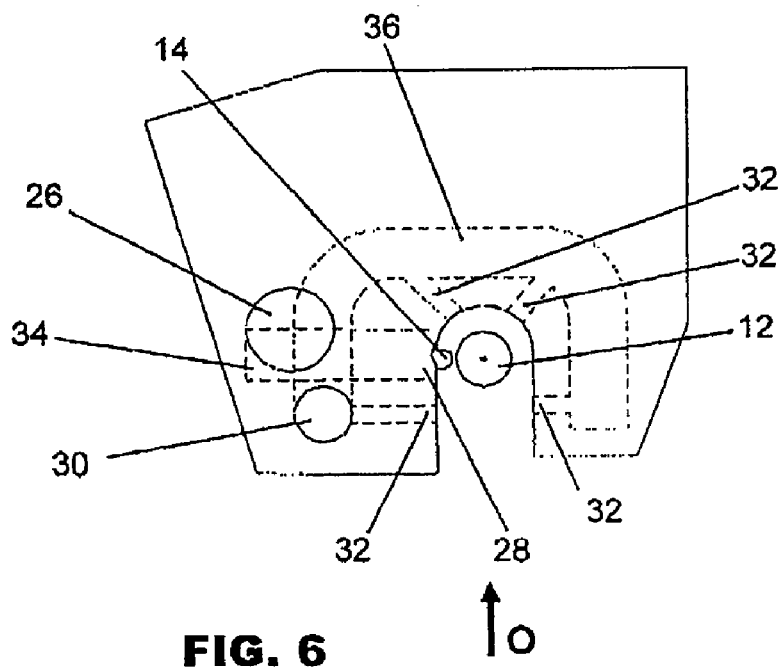
FIG. 6 is a top view of the gas supplying apparatus according to the second embodiment of the invention further illustrating the paths of respective vacuum channels within the apparatus.

FIG. 6 is a top view of the gas supplying apparatus 22 according to the second embodiment of the invention further illustrating the paths of respective conduits or vacuum channels 34, 36 within the apparatus 22. The capillary 12 is advantageously located near an end of the slot 24 that is furthest away from the side of the main body. The main gas inlet 26 is linked to the gas outlet 28 by way of a main vacuum channel 34.

There are multiple secondary gas outlets 32 in the illustrated embodiment, and they may all be linked to the secondary gas inlet 30 by way of secondary vacuum channels 36 as shown in dotted lines in FIG. 6. At least two of these multiple secondary gas outlets 32 may advantageously be located at the opening of the slot 24 next to the side of the main body so as to ensure that the bonding wire may be more thoroughly enveloped by the shielding gas during ball formation by blocking oxygen from the surrounding atmosphere from entering the slot 24 through its open front end. A position "O" from where the operator is looking at the capillary 12 is also shown.

Figure 7:
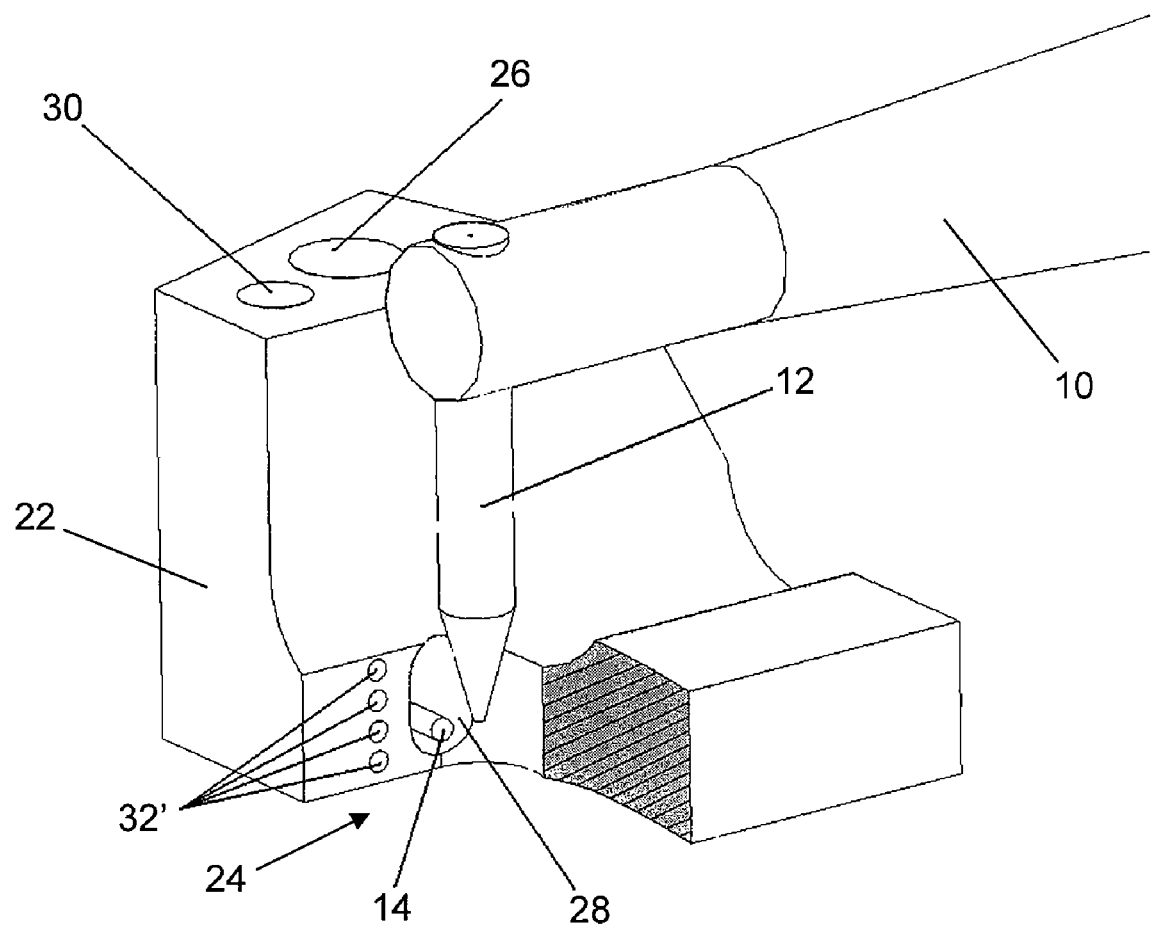
FIG. 7 is an isometric view of a gas supplying apparatus according to a third preferred embodiment of the invention with part of the apparatus removed to show a position of a tip of a capillary relative to an EFO torch.

FIG. 7 is an isometric view of a gas supplying apparatus 22 according to a third preferred embodiment of the invention with part of the apparatus removed to show a position of a tip of a capillary 12 relative to an EFO torch 14. In this embodiment, each secondary gas outlet 32 is replaced by multiple smaller secondary gas outlets 32'. The other features of the third preferred embodiment are similar to those described in the second preferred embodiment shown in FIG. 4 and no further explanation is necessary.

It should be appreciated that the narrow slot 24 confines the shielding gas within a small space and is operative to isolate the space from the surrounding air. In this way, the oxidation protection of the end of the bonding wire during molten ball formation can be more consistent than prior art gas supply methods.

Additional secondary gas outlets 32 surrounding the slot 24 supply shielding gas for further protection of the bonding wire without requiring a full enclosure to cover the capillary 12 and bonding wire as in the prior art. The need for requiring a full enclosure can further be avoided by locating at least some of the secondary gas outlets 32 near the front open end of the slot 24 to block the same.

As a result, the preferred embodiments of the invention make it much easier for an operator to align the capillary 12, EFO torch 14 and gas supplying apparatus 22 while maintaining a supply of shielding gas to prevent oxidation. Therefore, a more consistent set-up and oxidation protection can be achieved as compared to the prior art as a result of the better alignment. Having multiple gas outlets 28, 32 further allows greater flexibility to control the amount of shielding gas that is supplied. The preferred embodiments of the invention further avoid the need for expensive transparent high temperature material for enclosing the capillary and bonding wire during bonding.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for wire bonding comprising:
   a bonding tool comprising a horn and a capillary attached to the horn; and
   an apparatus for supplying a shielding gas during wire bonding, the apparatus for supplying shielding gas comprising:
   a main body;
   an elongated slot that extends into the main body from a side of the main body in a first direction and having a width, the slot also extending from a top surface to a bottom surface of the main body, in a second direction generally perpendicular to the first direction, from the side of the main body at one end of the width of the slot to the other end of the width of the slot, the slot also having a wall extending from the top surface to the bottom surface of the main body, the slot being sized to receive a tip of the capillary which is operable to pass through the slot in the second direction; and
   a gas outlet operative to supply shielding gas into the slot.

2. The apparatus as claimed in claim 1, wherein the gas outlet is formed inside the slot.

3. The apparatus as claimed in claim 2, further comprising a gas inlet and conduit formed in the main body that are connected to the gas outlet.

4. The apparatus as claimed in claim 1, further comprising an electronic flame-off torch located in the main body such that an end of the electronic flame-off torch protrudes into the slot.

5. The apparatus as claimed in claim 4, wherein the end of the electronic flame-off torch is coincident with and protrudes out of the gas outlet.

6. The apparatus as claimed in claim 1, wherein the slot has a narrow width that is not substantially larger than a width of the capillary to minimize the air space surrounding the tip of the capillary.

7. The apparatus as claimed in claim 1, wherein the first direction that the slot extends is generally parallel to a longitudinal axis of the horn.

8. The apparatus as claimed in claim 1, wherein the slot is configured such that an operator's view of the capillary from the side of the main body is not blocked by a part of the main body throughout a range of motion of the capillary during wire bonding.

9. The apparatus as claimed in claim 1, further comprising multiple secondary gas outlets operative to supply shielding gas into the slot.

10. The apparatus as claimed in claim 9, wherein the secondary gas outlets are formed inside the slot.

11. The apparatus as claimed in claim 10, wherein at least two secondary gas outlets are located at an opening of the slot next to the side of the main body.

12. The apparatus as claimed in claim 9, further comprising at least one secondary gas inlet that is fluidly connected to the secondary gas outlets.

13. The apparatus as claimed in claim 12, further comprising a plurality of conduits formed in the main body for connecting the at least one secondary gas inlet to the multiple secondary gas outlets.

14. The apparatus as claimed in claim 9, wherein an amount of shielding gas supplied through the gas outlet and the multiple secondary gas outlets respectively are independently controllable.

15. The apparatus as claimed in claim 1, wherein the capillary is configured to be located near an end of the elongated slot that is furthest away from the side of the main body during wire bonding.

16. The apparatus as claimed in claim 1, wherein the elongated slot comprises side walls extending in the first direction that are substantially parallel.

17. The apparatus as claimed in claim 1, wherein the elongated slot is in the form of a U-shaped recess.

* * * * *